United States Patent
Möttönen et al.

(10) Patent No.: US 11,210,601 B2
(45) Date of Patent: Dec. 28, 2021

(54) CIRCUIT ASSEMBLY, A SYSTEM AND A METHOD FOR COOLING QUANTUM ELECTRIC DEVICES

(71) Applicant: IQM Finland Oy, Espoo (FI)

(72) Inventors: Mikko Möttönen, Espoo (FI); Kuan Yen Tan, Helsinki (FI); Matti Partanen, Espoo (FI)

(73) Assignee: IQM Finland Oy, Espoo (FI)

( * ) Notice: Subject to any disclaimer, the term of this patent is extended or adjusted under 35 U.S.C. 154(b) by 418 days.

(21) Appl. No.: 16/066,207

(22) PCT Filed: Dec. 27, 2016

(86) PCT No.: PCT/FI2016/050925
§ 371 (c)(1),
(2) Date: Jun. 26, 2018

(87) PCT Pub. No.: WO2017/115008
PCT Pub. Date: Jul. 6, 2017

(65) Prior Publication Data
US 2020/0272925 A1 Aug. 27, 2020

(30) Foreign Application Priority Data

Dec. 29, 2015 (FI) .................................... 20156020
Jun. 14, 2016 (FI) .................................... 20165492

(51) Int. Cl.
*H01L 23/373* (2006.01)
*G06N 10/00* (2019.01)
(Continued)

(52) U.S. Cl.
CPC ......... *G06N 10/00* (2019.01); *H01L 23/3735* (2013.01); *H01L 27/18* (2013.01); *H01L 39/223* (2013.01)

(58) Field of Classification Search
CPC .. G06N 10/00; G06N 99/002; H01L 23/3735; H01L 27/18; H01L 39/223; H01L 39/22;
(Continued)

(56) References Cited

U.S. PATENT DOCUMENTS

2003/0173997 A1* 9/2003 Blais ..................... H01L 27/18
327/34
2007/0194225 A1* 8/2007 Zorn ..................... G01Q 10/06
250/306
(Continued)

OTHER PUBLICATIONS

Search Report from Finnish Patent Office for priority application FI 20156020 dated Feb. 22, 2016.
(Continued)

*Primary Examiner* — Shahed Ahmed
(74) *Attorney, Agent, or Firm* — McCarter & English, LLP

(57) ABSTRACT

A circuit assembly for cooling a quantum electrical device, use of said circuit assembly, a system and a method for cooling a quantum electric device are provided. The circuit assembly comprises a quantum electric device to be cooled, at least one normal-metal-insulator-superconductor (NIS) tunnel junction electrically connected to the quantum electric device and at least one superconductive lead for supplying a drive voltage $V_{QCR}$ for said at least one NIS tunnel junction. The quantum electric device is cooled when the voltage $V_{QCR}$ is supplied to at least one NIS tunnel junction, said voltage $V_{QCR}$ being equal to or below the voltage $N\Delta/e$, where N=1 or N=2, N is the number of NIS tunnel junctions electrically coupled in series with the means for generating the voltage, $\Delta$ is the energy gap in the superconductor density of states, and e is the elementary charge.

12 Claims, 5 Drawing Sheets

(51) Int. Cl.
*H01L 27/18* (2006.01)
*H01L 39/22* (2006.01)

(58) Field of Classification Search
CPC ..... H01L 23/373; H01L 39/221; H01L 23/38; H01L 39/00–2496; B82Y 10/00; Y10S 977/933
See application file for complete search history.

(56) References Cited

U.S. PATENT DOCUMENTS

| | | | |
|---|---|---|---|
| 2013/0281302 A1 | 10/2013 | Möttönen et al. | |
| 2014/0315723 A1* | 10/2014 | Moyerman | H01L 39/228 505/160 |
| 2017/0059214 A1* | 3/2017 | Shirron | F25B 21/00 |

OTHER PUBLICATIONS

Search Report from Finnish Patent Office for priority application FI 20165492 dated Dec. 15, 2016.
International Search Report and Written Opinion prepared by the Finnish Patent Office, acting as the International Searching Authority, for International Application PCT/FI2016/050925 dated Apr. 3, 2017.
International Preliminary Report on Patentability prepared by the Finnish Patent Office, acting as the International Searching Authority, for International Application PCT/FI2016/050925 dated Feb. 22, 2018.
Partanen, Matti et al.: "Observation of quantum limited heat conduction over macroscopic distances", Dated Oct. 15, 2015. In: arXiv:1510.0398v1 [online Oct. 14, 2015], Retrieved from the internet on Mar. 29, 2017: https://arxiv.org/abs/1510.03981 pp. 1-10.
Muhonen, Juha T. et al.: "Micrometre-scale refrigerators", *Reports on Progress in Physics*, IOP Publishing Ltd., Mar. 9, 2012, vol. 75, No. 4, pp. 1-23.
Giazotto, Francesco et al.: "Opportunities for mesoscopics in thermometry and refrigeration: Physicsand applications", *Reviews of Modern Physics*, 2006, vol. 78, No. 1, pp. 217-274.
Gladchenko, Sergiy et al.: "Superposition of Inductive and Capacitive Coupling in Superconducting LC Resonators",*IEEE Transactions on Applied Superconductivity IEEE*, Jun. 2011, vol. 21, No. 3, pp. 875-878.
Geerlings, K et al.: "Demonstrating a Driven Reset Protocol of a Superconducting Qubit", Dated Oct. 19, 2012. In: arXiv:1211.0491v2 [online Mar. 25, 2013], Retrieved from the internet on Mar. 29, 2017: https://arxiv.org/abs/1211.0491v2 pp. 1-5.
Tan, Kuan Yen et al.: "Quantum Circuit Refrigerator", Dated Jun. 16, 2016. In: arXiv:1606.04728v1 [online Jun. 15, 2016]. Retrieved from the internet on Mar. 29, 2017: https://arxiv.org/abs/1606.04728v1 pp. 1-12, Supplementary Information, pp. 1-14.
Timofeev, A et al.: "Electronic Refrigeration at the Quantum Limit", In: arXiv:0902.2584v2 [online Feb. 17, 2009], Retrieved from the internet on Feb. 16, 2016: http://arxiv.org/pdf/0902.2584v2 pp. 1-5.
Kuzmin, L.: "Quasiparticle cascade amplifier based on strong electron cooling of normal metal traps", *Physica C*, vol. 372, Aug. 1, 2002, pp. 457-461.
Di Marco, A. et al.: "Leakage Current of a Superconductor-Normal Metal Tunnel Junction Connected to a High-Temperature Environment", Dated Jul. 23, 2013, In: arXiv:1307.5446v1 [online Jul. 20, 2013]. Retrieved from the internet on Feb. 16, 2016: https://arxiv.org/pdf/1307.5446v1 pp. 1-11.
Shpinel, V.S: "Electron-Phonon Multiplier Involving a Cascade of NIS Tunnel Junctions and Hot-Electron Microcalorimeters", *Physics of Atomic Nuclei*, vol. 65, No. 1, 2002, pp. 38-40.
Giazotto, F. et al.: "Thermal properties in mesoscopics: physics and applications from thermometry to refrigeration", Dated Feb. 2, 2008. In: arXiv:cond-mat/0508093v4 [online May 15, 2006]. Retrieved from the internet on Feb. 16, 2016: http://arxiv.org/pdf/cond-mat/0808093v4.pdf pp. 1-59.
Wallraff, A. et al.: "Circuit Quantum Electrodynamics: Coherent Coupling of a Single Photon to a Cooper Pair Box", In: arXiv:cond-mat/0407325v1 [online Jul. 13, 2004]. Retrieved from the internet Feb. 16, 2016: http://arxiv.org/pdf/cond-mat/0407325v1.pdf pp. 1-8.
Koch, J et al.: "Charge insensitive qubit design derived from the Cooper pair box", Dated Sep. 26, 2007, In: arXiv:cond-mat/0703002v2 [online Sep. 26, 2007], Retrieved from the internet on Feb. 16, 2016: http://arxiv.org/pdf/cond-mat/0703002v2.pdf pp. 1-21.
Goppi, M. et al.: "Copolanar Waveguide Resonators for Circuit Quantum Electrodynamics", Dated Jul. 25, 2008. In: arXiv:0807.4094v1 [online Jul. 25, 2008. Retrieved from the internet on Feb. 16, 2016: https://arxiv.org/pdf/0807.4094v1.pdf pp. 1-8.
Jenkins, Mark David et al.: "Nanoscale constrictions in superconducting coplanar waveguide resonators", Dated Oct. 23, 2014, In: arXiv:1409.1040v2 [online Oct. 22, 2014]. Retrieved from the internet on Feb. 16, 2016: http://arxiv.org/pdf/1409.1040v2.pdf pp. 1-4.
Ingold, Gert-Ludwig et al.: "Chapter 2 Charge Tunneling Rates in Ultrasmall Junctions", *Single Charge Tunneling*, edited by H. Grubert and M.H. Devoret, NATO ASI Series B, vol. 294, Plenum Press, New York 1992, pp. 21-107.
Extended European Search Report issued by European Patent Office for corresponding European application 16881324.4 dated Jul. 25, 2019.

* cited by examiner

US 11,210,601 B2

CIRCUIT ASSEMBLY, A SYSTEM AND A METHOD FOR COOLING QUANTUM ELECTRIC DEVICES

CROSS-REFERENCE TO RELATED APPLICATIONS

This application is the National Stage entry under 35 U.S.C. § 371 of international Application Number PCT/FI2016/050925 filed on Dec. 27, 2016, published on Jul. 6, 2017 under publication number WO 2017/115008 A1, which claims the benefit of priority under 35 U.S.C. § 119 of Finnish patent application number 20156020 filed Dec. 29, 2015 and Finnish patent application number 20165492 filed Jun. 14, 2016.

FIELD OF THE INVENTION

The present invention relates to the field of quantum computing and quantum technology and, more precisely, to devices for cooling quantum electric devices.

BACKGROUND OF THE INVENTION

Quantum technology and quantum computing constitute an area that has been much studied but that encompasses many challenges. There are two different kinds of quantum computing paradigms. The gate-based paradigm consists of quantum bits, qubits, forming logic gates such as AND, OR, NOT similar to the classical Si-based computing logic. Another paradigm is adiabatic quantum computing, which is often used for optimization problems. It is based on quantum annealing, i.e. driving and dissipation. In the adiabatic quantum computing one relies on the quantum adiabatic evolution and non-tunable sources of dissipation.

In the prior art, the quantum devices suffer from high natural temperatures and long times for their initialization. For example, in a quantum computer, the initialization of quantum bits, qubits, is a problem.

Previously demonstrated qubit initialization schemes in the gate-based paradigm include sideband cooling, Sisyphus cooling, Purcell effect, and zeroing registers, all of which require the qubit energy splitting to be tuned. Such tuning is in many cases undesirable, for example because the requirement of large tuning of the qubit frequency reserves a broad frequency band for each qubit, and rendering scalability is a challenging task due to frequency crowding. The frequency tunability may also provide added dephasing arising from the low frequency noise in the tuning parameter, which can be compensated for to large extent by working at the flux-insensitive point.

Qubit initialization can also be carried out by measurement and classical feedback. However, the fidelity in such feedback is limited by the measurement and gate fidelities, which clearly increases their threshold values for fault-tolerant computing compared with perfect initialization. Furthermore, active feedback requires excess resources.

In general, the main problem of the prior art is that previously it has not been possible to efficiently cool down quantum devices, such as quantum resonators.

In other words, there exists a fundamental demand for an efficient cooling or refrigerating method of electric quantum devices, in order to enable or enhance their performance, by utilizing a microscale component.

Objective of the Invention

The objective of the invention is to provide a device, a system and a method which can enable or enhance the performance of quantum technological devices such as radiation detectors and quantum computers by efficient initialization. This is realized by control of in-situ-tunable dissipative environments for quantum devices.

SUMMARY OF THE INVENTION

The circuit assembly, the system, the method and the uses according to the present invention are characterized by what is presented in the claims.

The present invention introduces a circuit assembly for cooling a quantum electric device comprising a quantum electric device to be cooled. As characteristic features, the circuit assembly further comprises at least one normal-metal-insulator-superconductor (NIS) tunnel junction electrically connected to the quantum electric device, at least one superconductive lead electrically connected to the at least one normal-metal-insulator-superconductor (NIS) tunnel junction for supplying a drive voltage $V_{QCR}$ for said at least one normal-metal-insulator-superconductor (NIS) tunnel junction, wherein the energy difference $h\omega_0/(2\pi)$ between two energy states of the quantum electric device is in the range of $h(0.3\text{-}300\text{ GHz})$, where h is the Planck constant; and wherein the effective capacitance C of the quantum electric device substantially follows an approximation: $C=\pi/(\rho R_K \omega_0)$, wherein $R_K$ is the von Klitzing constant, and $\rho$ is the zero-temperature probability of a photon capture event in the course of a single-electron tunneling event which lies in the range of 0.00001-0.1. The drive voltage $V_{QCR}$ can be either DC or AC voltage.

In one embodiment of the present invention, the tunneling resistance $R_T$ of the at least one NIS tunnel junction is substantially in the range of 10 kΩ-100 MΩ.

In one embodiment of the present invention, the circuit assembly further comprises two normal-metal-insulator-superconductor (NIS) tunnel junctions electrically coupled in series with respect to one another and to at least one superconductive lead, and the quantum electric device electrically coupled in between said two normal-metal-insulator-superconductor (NIS) tunnel junctions.

In one embodiment of the present invention, the circuit assembly further comprises two normal-metal-insulator-superconductor (NIS) tunnel junctions electrically coupled in parallel with respect to one another between the quantum electric device and the at least one superconductive lead.

In one embodiment of the present invention, the circuit assembly further comprises at least one lithographically manufactured interdigitated capacitor electrically coupled in series between the at least one normal-metal-insulator-superconductor (NIS) tunnel junction and the quantum electric device.

In one embodiment of the present invention, the circuit assembly further comprises at least one lithographically manufactured thin-film parallel plate capacitor comprising at least one layer comprising two superconductive films separated by a dielectric layer, said thin-film parallel plate capacitor being electrically coupled in series between the at least one normal-metal-insulator-superconductor (NIS) tunnel junction and the quantum electric device.

In one embodiment of the present invention, the circuit assembly further comprises at least one lithographically manufactured interdigitated capacitor electrically coupled in series between the at least one normal-metal-insulator-superconductor (NIS) tunnel junction and a ground.

In one embodiment of the present invention, the circuit assembly further comprises at least one lithographically manufactured thin-film parallel plate capacitor comprising at least one layer, said layer comprising two superconductive films separated by a dielectric layer, said thin-film parallel plate capacitor being electrically coupled in series between the at least one normal-metal-insulator-superconductor (NIS) tunnel junction and a ground.

In one embodiment of the present invention, the circuit assembly further comprises at least one lithographically manufactured resistor electrically coupled in series between the at least one normal-metal-insulator-superconductor (NIS) tunnel junction and the quantum electric device.

In one embodiment of the present invention, the circuit assembly further comprises at least one coil comprising superconductive wires and electrically coupled in series between the at least one contact element for supplying a drive voltage $V_{QCR}$ and the at least one normal-metal-insulator-superconductor (NIS) tunnel junction.

In one embodiment of the present invention, the drive voltage $V_{QCR}$ is AC voltage. In case $V_{QCR}$ is AC voltage, it can be supplied to the at least one NIS tunnel junction either directly or in such a manner that said AC voltage passes through a superconductive resonator first. Typically, the frequency of said supplied AC voltage has to be at least several times smaller than that of the energy packet (photon) emitted by the quantum electric device.

In one embodiment of the present invention, the quantum electric device comprises at least one of the following: a quantum resonator, a qudit, a photodetector. Further, the quantum electric device may comprise at least one circuit comprising at least one quantum resonator, qudit or photodetector. In one embodiment of the present invention, the quantum electric device comprises at least one of the following: a one-quarter wavelength resonator, a superconducting coplanar waveguide (CPW) resonator, a quantum annealer.

According to a second aspect of the invention, the inventive idea includes a system for cooling a quantum electric device. The characteristic features of the invention include a circuit assembly comprising a quantum electric device to be cooled, at least one normal-metal-insulator-superconductor (NIS) tunnel junction electrically connected to the quantum electric device, at least one superconductive lead electrically connected to the at least one normal-metal-insulator-superconductor (NIS) tunnel junction for supplying a drive voltage $V_{QCR}$ for said at least one normal-metal-insulator-superconductor (NIS) tunnel junction; means for generating a drive voltage $V_{QCR}$. It is obvious for a skilled person that the means for generating a drive voltage $V_{QCR}$ are electrically connected to the at least one superconductive lead in the manner suitable for providing a desired drive voltage $V_{QCR}$ to the at least one normal-metal-insulator-superconductor (NIS) tunnel junction. It shall be noted that according to the present invention said means for generating a drive voltage $V_{QCR}$ may comprise a DC voltage generator (i.e. a DC power supply) or an AC voltage generator (i.e. an AC power supply), i.e. $V_{QCR}$ supplied to at least one NIS tunnel junction can be DC voltage or AC voltage.

In one embodiment of the present invention, the system for cooling a quantum electric device further comprises a quantum electric device to be cooled, first and second normal-metal-insulator-superconductor (NIS) tunnel junctions electrically connected to the quantum electric device, a first superconductive lead electrically connected to the first NIS tunnel junction for supplying a drive voltage $V_{QCR}$ for said first NIS tunnel junction and a second superconductive lead electrically connected to the second NIS tunnel junction for supplying a drive voltage $V_{QCR}$ for said second NIS tunnel junction, means for generating a drive voltage $V_{QCR}$ electrically connected to the first and the second superconductive leads, wherein the two normal-metal-insulator-superconductor (NIS) tunnel junctions are electrically coupled in series with one another and the quantum electric device is coupled in between said NIS tunnel junctions.

In one embodiment of the present invention, the system for cooling a quantum electric device further comprises two normal-metal-insulator-superconductor (NIS) tunnel junctions electrically coupled in parallel with one another and in series with the quantum electric device and the means for generating a drive voltage $V_{QCR}$.

In one embodiment of the present invention, the system for cooling a quantum electric device further comprises at least one lithographically manufactured interdigitated capacitor electrically coupled in series between the at least one normal-metal-insulator-superconductor (NIS) tunnel junction and the quantum electric device to be cooled.

In one embodiment of the present invention, the system for cooling a quantum electric device further comprises at least one lithographically manufactured thin-film parallel plate capacitor comprising at least one layer comprising two superconductive films separated by a dielectric layer, said thin-film parallel plate capacitor being electrically coupled in series between the at least one normal-metal-insulator-superconductor (NIS) tunnel junction and the quantum electric device to be cooled.

In one embodiment of the present invention, the system for cooling a quantum electric device further comprises at least one lithographically manufactured interdigitated capacitor electrically coupled in series between the at least one normal-metal-insulator-superconductor (NIS) tunnel junction and a ground.

In one embodiment of the present invention, the system for cooling a quantum electric device further comprises at least one lithographically manufactured thin-film parallel plate capacitor comprising at least one layer, said layer comprising two superconductive films separated by a dielectric layer, said thin-film parallel plate capacitor being electrically coupled in series between the at least one normal-metal-insulator-superconductor (NIS) tunnel junction and a ground.

In one embodiment of the present invention, the system for cooling a quantum electric device further comprises at least one lithographically manufactured resistor electrically coupled in series between the at least one normal-metal-insulator-superconductor (NIS) tunnel junction and the quantum electric device to be cooled.

In one embodiment of the present invention, the system for cooling a quantum electric device further comprises at least one coil comprising superconductive wires and electrically coupled in series between the at least one superconductive lead for supplying a drive voltage $V_{QCR}$ and the at least one normal-metal-insulator-superconductor (NIS) tunnel junction.

In one embodiment of the present invention, the means for generating a drive voltage $V_{QCR}$ comprise an AC voltage generator. In said embodiment of the present invention the voltage $V_{QCR}$ is AC voltage.

In one embodiment of the present invention, the system for cooling a quantum electric device comprises the quantum electric device that comprises at least one of the following: a quantum resonator, a qudit, a photodetector. Further, the quantum electric device may comprise at least one circuit comprising at least one quantum resonator, qudit or photodetector. In addition, the quantum electric device may comprise at least one of the following: a one-quarter wavelength resonator, a superconducting coplanar waveguide (CPW) resonator, a quantum annealer.

According to a third aspect of the invention, the inventive idea includes a method for cooling a quantum electric device. The characteristic features of the invention include supplying a drive voltage $V_{QCR}$ to at least one normal-metal-insulator-superconductor (NIS) tunnel junction, said voltage $V_{QCR}$ being equal to or below the voltage $N\Delta/e$, where N is the number of NIS tunnel junctions electrically coupled in series with the means for generating the voltage and N is one or two, $\Delta$ is the gap in the superconductor density of states and e is the elementary charge. Supplying a drive voltage $V_{QCR}$ that is equal to or below $\Delta/e$ to a NIS or SIN tunnel junction, the $V_{QCR}$ being equal to or below $2\Delta/e$, to a SIN-SIN or to SINIS tunnel junctions electrically coupled in series between the means for generating the drive voltage $V_{QCR}$ and the quantum electric device to be cooled initiates photon-assisted single-electron tunneling from a normal-metal to a superconductor in at least one tunnel junction and cools the quantum electric device electrically connected to said at least one tunnel junction.

In one embodiment of the present invention the energy difference $h\omega_0/(2\pi)$ between two energy states of the quantum electric device to be cooled is in the range of h(0.3-300 GHz), where h is the Planck constant; and the effective capacitance C of the quantum electric device to be cooled is given by $C=\pi/(\rho\, R_K\, \omega_0)$, wherein $R_K$ is the von Klitzing constant, and $\rho$ is the zero-temperature probability of a photon capture event in the course of a single-electron tunneling event which lies in the range of 0.00001-0.1.

In one embodiment of the present invention, the voltage $V_{QCR}$ is equal to or below the voltage $N\Delta/e - E/e$, wherein E is the particular quantum of energy that is emitted by the quantum electric device.

In one embodiment of the present invention, the method further comprises the steps of:
determining a target temperature of the quantum electric device,
supplying the current $I_{th}$ to a NIS tunnel junction,
obtaining a voltage $V_{th}$ across said NIS tunnel junction,
determining the electron temperature of the normal-metal based on the obtained voltage $V_{th}$,
setting the voltage $V_{QCR}$ to zero when the target temperature of the quantum electric device is reached.

In one embodiment of the present invention, the voltage $V_{QCR}$ supplied to at least one NIS tunnel junction in order to initiate photon-assisted single-electron tunneling from normal-metal to the superconductor is AC voltage.

According to the present invention, the circuit assembly is used for cooling a quantum annealer.

According to the present invention, the system is used for cooling a quantum annealer.

A novel circuit assembly for cooling a quantum electric device, a system for cooling a quantum electric device and a method for cooling a quantum electric device are introduced. In addition, novel use of the circuit assembly and the system for cooling a quantum annealer is introduced. The distinctive advantage of the circuit assembly according to the present invention is e.g. the size—the circuit assembly dimensions are about a single micrometer. A typical size of the circuit assembly is 4200 nm×250 nm×20 nm. The circuit assembly according to the present invention is also versatile—almost independent of the device to be cooled, meaning that almost any type of a quantum device may be cooled with the described circuit assembly comprising at least one NIS tunnel junction. It requires extremely small currents to operate and hence can be conveniently integrated with electric quantum circuits. The circuit assembly according to the present invention can be switched on and off by using its drive voltage $V_{QCR}$.

The circuit assembly according to the present invention is a very versatile device that can be integrated with almost any electronic component compatible with the low-temperatures setup. For example, the circuit assembly can be used to initialize qubits in a quantum computer or the quantum register of a quantum annealer. In principle, any quantum device benefits from the initialization or controlled amount of dissipation arising from the quantum circuit refrigerator. Moreover, the circuit assembly can also be used to cool down classical electric components of a microscopic and macroscopic scale as long as said components are weakly coupled to any other thermal baths, meaning that their thermal conductance is typically in the range of a thermal conductance quantum go, i.e. about 946 fW/K$^2$ multiplied by the temperature. In practice, the components to be cooled must have a very low thermal mass and typically their heat capacity is about between $10^{-20}$ J/K and $10^{-15}$ J/K.

The circuit assembly according to the present invention absorbs the excitations out from a quantum electric device leaving it to about half the electron temperature of the circuit assembly. The minimum temperature that one can obtain with the circuit assembly is half the electron temperature of the normal-metal. Therefore, it is possible to cascade several normal-metal-insulator-superconductor (NIS) tunnel junctions in a linear chain (i.e. electrically coupling NIS tunnel junctions in series with the means for generating the drive voltage $V_{QCR}$) such that each NIS tunnel junction in the chain is cooling the normal-metal island of the next NIS tunnel junction. In this arrangement, the NIS tunnel junction located at the first end of the chain is electrically connected to the means for generating a drive voltage $V_{QCR}$ and the NIS tunnel junction located at the second end of the chain is electrically connected to the quantum electric device. The end result of such a cascade is lower final temperature of the quantum device. If more cooling power is required, several quantum circuit refrigerators could be run in parallel.

The embodiments of the invention described hereinbefore may be used in any combination with each other. Several of the embodiments may be combined together to form a further embodiment of the invention. A product, a method or use, to which the invention is related, may comprise at least one of the embodiments of the invention described hereinbefore.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
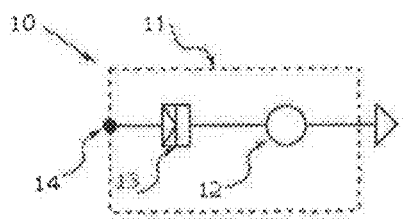
FIG. 1 illustrates the structure of a circuit assembly according to the present invention.

The present invention concerns quantum electric devices suffering from high natural temperatures (typically above 100 mK) and long times (typically above a microsecond) for their initialization. There have not been provided suitable devices or methods for cooling quantum electric devices, such as quantum resonators. By a quantum electric device is meant herein a device, the functional operation of which controllably utilizes its discrete quantum-mechanical energy spectrum at a precision well better than individual levels. This definition implies, for example, that the lifetime t of the individual quantum levels has to be long compared with the operation time and level splitting. Therefore, e.g. superconductive transmission lines or waveguides having a continuous energy spectrum or resistors are not quantum electric devices.

It was discovered in the present invention that when a certain voltage is supplied to at least one normal-metal-insulator-superconductor (NIS) tunnel junction that is electrically (i.e. a galvanic, capacitive or inductive connection) connected (or coupled) to a quantum electric device, photon-assisted single-electron tunneling from normal-metal to the superconductor in the NIS tunnel junction is initiated. Said single-electron tunneling requires energy which is absorbed in a form of an energy packet (photon) emitted by the quantum electric device. The photon emission causes the quantum electric device to decay to a lower energy state. Decaying to a lower energy state cools the quantum electric device.

For the present invention, photon-assisted single-electron tunneling through a NIS tunnel junction can be described by means of the Fermi golden rule, taking into account the voltage fluctuations arising from the electromagnetic environment of the junction. In a zero-temperature limit for a parallel LC oscillator (a prototypical quantum electric device) acting as the environment, the probability density for the environment to absorb energy E in the course of single-electron tunneling through a NIS tunnel junction is $$P(E) \approx e^{-\rho} \sum_{k=0}^{\infty} \frac{\rho^k}{k!} \delta(E - k\eta\omega_0) = \sum_{k=0}^{\infty} q_k \delta(E - k\eta\omega_0), \quad (1)$$

where $\omega_0$ is the energy difference between two energy states of the quantum electric device, the coefficient $q_k$ equals the probability of emitting k quanta of energy to the oscillator (the quantum electric device) in the course of single electron tunneling. Note that $q_1 = \rho$, and hence if we can find $q_1$, we also know the effective capacitance. The parameter $\rho$ is the zero-temperature probability of a photon capture event in the course of a single-electron tunneling event $$\rho = \frac{\pi}{CR_K\omega_0}, \quad (2)$$

where $R_K$ is the von Klitzing constant and C is capacitance of the oscillator.

For a circuit assembly and a system for cooling a quantum electrical device according to the present invention, $\rho$ lies in the range of 0.00001-0.1. In this range the elastic tunneling events (k=0) dominate the probabilities, for which events no heat exchange with the quantum electric device takes place, and the single-photon absorption events (k=1) dominate the two-photon events (k=2). For a general quantum electric device, $\hbar\omega_0/(2\pi)$ is the energy difference of the transition to be refrigerated and C is the effective capacitance defined through equation (2). Note that the effective capacitance may be different for each transition and becomes infinite for forbidden transitions, i.e., in the case where the matrix element of the charge shift operator across the NIS junction vanishes in the Fermi golden calculation.

If $\rho$ is too large it will lead to too many unwanted photon-assisted tunneling events, whereas if p is too small it will reduce the cooling power of the circuit assembly for cooling a quantum electric device to be too small for practical use.

In the case of the co-planar waveguide resonator coupled as strongly as possible to the tunnel junction, for example, the effective capacitance depends on the resonator length L and the resonator capacitance per unit length $C_1$, $C=L C_1/2$. This condition arises from mapping the fundamental mode of the CPW resonator into a single LC oscillator with matching the resonance frequencies and the voltage at the NIS junction. The voltage matching condition is important since the photon-assisted tunneling is induced by the voltage dynamics of the quantum device.

A large spectrum of useful quantum devices, such as superconducting transmon qubits, are only slightly non-linear and it is obvious to proceed with the mapping in the same way as for the CPW resonator. Let $E_{01}$ be the energy gap of the transition from the quantum state $|0\rangle$ to the quantum state $|1\rangle$, and $V_{op}$ the voltage operator of the quantum device describing the induced voltage across the tunnel junction. Thus we must choose C and L such that $E_{01} = \hbar\omega_0/(2\pi) = h/(2\pi(LC)^{1/2})$ and $V_{op}^{10} = V_0 = (\hbar\omega_0/(4\pi C))^{1/2}$, where $V_{op}^{10} = \langle 1|V_{op}|0\rangle$ and $V_0$ is the voltage amplitude of a single photon in the LC oscillator.

In the case of a general quantum device which may be very non-linear, its properties are not characterized any more by just the two lowest-energy states. However, by replacing states $|0\rangle$ and $|1\rangle$ in the above method, we obtain a useful approximation. Note also that quantum devices operate at low temperatures and typically only two lowest-energy states needs to be considered in their refrigeration. In this case, the truncation of the Hamiltonian allows for the above described mapping into a simple LC oscillator.

The effective capacitance can be viewed as the capacitance of the LC oscillator, for which $\hbar\omega_0/(2\pi)$ matches the energy splitting of the general quantum electric device and for which the voltage induced by single excitation matches that induced by the general quantum electric device across the tunnel junction.

Equation (2) provides a way to understand the working range 0.00001-0.1 for ρ. If ρ is close to unity, we observe that multi-photon processes are only weakly suppressed. Hence, unwanted photon-assisted tunneling may too often occur at low drive voltages, destroying the coherence of the quantum electric device during its operation. Furthermore, a large p also implies that the NIS (or SIN) junction becomes strongly coupled to the quantum electric device, which increases the ohmic losses related to the electric current flowing through the normal-metal part of the tunnel junction. On the other hand, we observe from equation (1) that the desired single-photon absorption is linearly proportional to ρ, which means that the time it takes to reset a quantum electric device is directly proportional to ρ. We can obtain a lower bound $eR_K/(\rho\Delta/e)$ for the reset time constant by the requirement that the tunneling resistance of the junction has to be larger than the von Klitzing constant $R_K$ and the voltage drop smaller than the gap voltage $\Delta/e$. Assuming that we need five time constants to accurately reset the system, ρ=0.00001 yields a lower bound for the reset time to be one microsecond. The desired reset time in superconducting quantum bits is about one microsecond or less.

The tunneling rate for the electrons in the forward direction is $\vec{\Gamma}$. The rate can further be expressed as sums of contributions from the different processes of emission, absorption and elastic tunneling $$\vec{\Gamma}^T_{0\to 1} = \frac{\rho}{1+\rho}\frac{1}{e^2 R_T}\int_{-\infty}^{\infty} dE f_N(E-eV)\eta_S(E-\eta\omega_0)[1-f_S(E-\eta\omega_0)] \quad (3)$$

$$\vec{\Gamma}^T_{1\to 0} = \frac{\rho}{1+\rho}\frac{1}{e^2 R_T}\int_{-\infty}^{\infty} dE f_N(E-eV)\eta_S(E+\eta\omega_0)[1-f_S(E+\eta\omega_0)],$$

where $R_T$ is tunneling (i.e. tunnel) resistance of a NIS tunnel junction. The general concept of tunneling resistance is known for a skilled person and thus no detailed discussion or explanation is required. In practice, $R_T$ shall be over about 10 kΩ; otherwise, multiple electrons will simultaneously tunnel in the NIS junction instead of single-electron tunneling. On the other hand, if $R_T$ is over about 100 MΩ, the tunneling rate will be too slow to be used in cooling of a quantum electric device.

The Fermi-Dirac distribution in equation (3) is given by $$f(E,T) = \frac{1}{e^{E/(k_B T)}+1}, \quad (4)$$

where $k_B$ is the Boltzmann constant and T is the temperature of the normal metal (for $f_N$) or the superconductor (for $f_S$). The quasiparticle density of states in the superconductor can be parametrized by $$\eta_S(E) = \left|\text{Re}\frac{E/\Delta + i\gamma_D}{\sqrt{(E/\Delta + i\gamma_D)^2 - 1}}\right|, \quad (5)$$

where $\gamma_D$ is the Dynes parameter and Δ is the superconductor energy gap.

For completeness, it is discussed below how to accurately estimate the transition rates induced to a general quantum device by photon-assisted tunneling. It can be carried out using the standard Fermi golden rule for a transition rate $$\Gamma_{i'\to f'} = 4\pi^2 |\langle f'|H_T|i'\rangle|^2 \delta(E_{f'}-E_{i'}),$$

where i' and f' denote the initial and the final quantum states (with energies $E_{i'}$ and $E_{f'}$) in the large product space of the quantum device and the microscopic excitations of the electrons. The prime denotes this product space as opposed to just the quantum device without the prime. Above, $H_T$ is the standard tunneling Hamiltonian. This straightforward calculation yields for the transition rate between the states |m> and |n> of a general quantum device $$\Gamma_{mn} = \vec{\Gamma}_{mn} + \overleftarrow{\Gamma}_{mn}$$
$$= \frac{A^{\to}_{mn}}{e^2 R_T}\int d\varepsilon \eta_S(\varepsilon)[1-f_S(\varepsilon)]f_N(\varepsilon - E_{mn} - eV) +$$
$$\frac{A^{\leftarrow}_{mn}}{e^2 R_T}\int d\varepsilon \eta_S(\varepsilon - E_{mn} - eV)[1-f_N(\varepsilon)]f_S(\varepsilon - E - eV)$$

where $$A^{\to}_{mn} = |<m;1|\exp\left(\frac{2\pi e\Phi}{h}\right)|n;0>|^2 \text{ and } A^{\leftarrow}_{mn} = |<m;0|\exp\left(-\frac{2\pi e\Phi}{h}\right)|n;1>|^2.$$

Above the operator $$\exp = \left(\frac{2\pi e\Phi}{h}\right)$$

moves one electron from the normal metal to the superconductor and operator $$\exp = \left(-\frac{2\pi e\Phi}{h}\right)$$

moves one electron from the superconductor to the normal metal. Notation <m;k| means the mth state of the quantum device provided that there is k electrons (excess from neutrality) on the normal metal island. The tunneling rates $\Gamma_{mn}$ uniquely describe the refrigeration effect of the NIS junction on the quantum device, and they can be mapped into the parameter ρ (and the effective capacitance) using equation (3).

According to the present invention, in order to cool a quantum electric device a drive voltage has to be supplied in a circuit assembly comprising at least one normal-metal-insulator-superconductor (NIS) tunnel junction and a quantum electric device. The drive voltage $V_{QCR}$ for said at least one NIS tunnel junction is supplied via at least one superconductive lead that is electrically coupled to the at least one NIS tunnel junction. The at least one superconductive lead can be electrically connected to the means for generating the drive voltage via bondwires. It is also possible to generate the drive voltage by means of a voltage generator situated on the same chip comprising the NIS tunnel junctions and a quantum electric device. The drive voltage $V_{QCR}$ can be either DC or AC voltage. Herein, the abbreviation QCR stands for a quantum circuit refrigerator, the name used by the inventors for the circuit assembly for cooling a quantum electric device according to the present invention.

For aluminum as the superconductor, the typical drive voltage $V_{QCR}$ is around 0.1 mV-0.3 mV, preferably around 0.2 mV, in case the circuit assembly comprises only one NIS tunnel junction electrically coupled in series between the means for generating a drive voltage and a quantum electric device. In case the circuit assembly comprises two NIS tunnel junctions electrically coupled in series with one another, the drive voltage $V_{QCR}$ is typically around 0.4 mV.

After the drive voltage $V_{QCR}$ has been supplied from an external generator or a power supply to the circuit assembly via the at least one superconductive lead, said drive voltage $V_{QCR}$ is further supplied to at least one NIS tunnel junction. One superconductive lead is sufficient to supply $V_{QCR}$ to the at least one NIS tunnel junction. Said at least one superconductive lead is a superconductor and may be lithographically manufactured via metal evaporation. In one embodiment of the present invention, said at least one superconductive lead comprises aluminum.

When $V_{QCR}=0$ mV, it is possible to estimate, based on the Ohm's law, the lifetime t of the individual quantum level of the quantum electric device due to Ohmic losses. If the electrical current I passing through the normal-metal and relating to the state of the quantum electric device is too high, it will quickly destroy the quantum coherence even if $V_{QCR}$ is low. However, it shall be noted that I does not necessarily harm the cooling capability of the circuit assembly according to the present invention. It is possible to cool a quantum electric device with the circuit assembly even when the current I (and thus the electrical power) is high.

According to the Ohm's law, the dissipated power is given by $P=RI^2$, where R is the series resistance of the normal-metal in view of the quantum electric device. Thus, the lifetime t is limited from above by $$t = \frac{\eta \omega_0}{P} = \frac{\hbar \omega_0}{2\pi R I^2}. \tag{6}$$

When the capacitance of the NIS tunnel junction $C_j$ is small in comparison to R (typical desired working parameters), we have $$P = \frac{R\eta \omega_0^3 N^2 C_j^2}{C},$$

where N is the number of NIS junctions and C is the effective capacitance. Therefore, the lifetime limited by power P is $$t_1^R = \frac{C}{N^2 C_j^2 \omega_0^2 R}. \tag{7}$$

The lifetime varies for different quantum electric devices. For superconductive qubits used for gate-based quantum computing, the lifetime shall be at least in the range of 0.1 ms. For quantum annealers it may be many orders of magnitude lower. The lower bound for the lifetime is $t=2\pi/\omega_0$, since at the lower values the lifetime t of the individual quantum levels is not long enough compared with the operation time and level splitting, and such a system does not meet the definition of a quantum electric device indicated earlier in this chapter. In practice, the normal-metal is fabricated so that the series resistance R of the normal-metal in view of the quantum electric device is as low as possible (preferably below 1 Ohm). After that, the capacitance of the NIS tunnel junction $C_j$ is adjusted so that the lifetime of the individual quantum level of the quantum electric device due to Ohmic losses is suitable for the present application (cooling of a quantum electric device) and not too short (see discussion above).

The voltage $V_{QCR}$ shall be equal to or below the voltage $N\Delta/e$, where N is the number of NIS tunnel junctions electrically coupled in series with the means for generating a drive voltage, $\Delta$ is the gap parameter in the superconductor density of states and e is an elementary charge. For a NIS or SIN tunnel junction $V_{QCR}$ is equal to or below the voltage $\Delta/e$, and for SIN-SIN or SINIS tunnel junctions $V_{QCR}$ is equal to or below $2\Delta/e$. It is obvious for a skilled person that the circuit assembly further comprises the necessary circuitry that brings different components into a metallurgical (and thus into an electrical) contact with each other.

Supplying the voltage $V_{QCR}$ to the NIS tunnel junction, $V_{QCR}$ being equal to or below the voltage $N\Delta/e$, initiates photon-assisted single-electron tunneling from normal-metal to the superconductor in the NIS tunnel junction. As described above, the energy needed for said single-electron tunneling is absorbed in a form of a photon emitted by the quantum electric device. As the result, the quantum electric device loses energy and cools.

Setting the drive voltage to zero when the target temperature of the quantum electric device is reached stops the photon-assisted single-electron tunneling and thus stops the cooling of the quantum electric device. When the quantum electric device is not cooled (the drive voltage is zero), the photon-assisted single-electron tunneling rate and the rate due to ohmic losses are lower than the required inverse lifetime of the quantum electric device to be cooled. When the drive voltage is supplied to a NIS tunnel junction, the quantum electric device is cooled and the photon-assisted single-electron tunneling rate is much greater than the other decay rates of the quantum electric device to be cooled.

Next, the theoretical background of the normal-metal-insulator-superconductor (NIS) tunnel junction will be discussed. One or more superconductive very small measurement heads can be coupled to the normal-metal piece and, additionally, a thin layer of an insulator is disposed between the so-called SN structures, whereby a so-called SIN or NIS junction, i.e. a superconductor-insulator-normal metal junction, is formed over said interface. For example, aluminum oxide can be used as the insulator. The principle of this structure is that, in this connection, the tunneling effect of the electrons can be utilized between the superconductor and the normal-metal. In this case, a current-voltage characteristic curve can be observed at the SIN junction. Typically, at such a junction, there is not much tunneling of a higher order, and, on this account, the current propagating over the junction consists of sequential tunneling of single electrons, being further formed by excitation of quasi-particles in the superconductor. According to the BCS (Bardeen-Cooper-Schrieffer) theory, the minimum energy difference between the excited states is $2\Delta$, which is the minimum energy required to break one so-called Cooper pair. As an approximation, at a temperature T=0 K:

$$2\Delta \approx 3.5 k_B T_c \tag{5}$$

where $k_B$ is the Boltzmann constant and $T_c$ is the critical temperature of the material being examined (below which superconductivity is possible). The order of magnitude of this energy in many materials is of the order of a millesimal of an electron-volt. Heat energy thus breaks a Cooper pair very easily, and a superconductive material in this case becomes a so-called normal-metal.

In the ideal situation, at a temperature T=0K, the current does not propagate through the NIS junction when the voltage is less than Δ/e. When the temperature is between $$0 \leq T << \frac{\Delta}{k_B},$$

the current propagating over the interface depends on the temperature of the normal-metal.

FIG. 1 shows an exemplifying structural view (not in scale) of a circuit assembly according to the present invention. The circuit assembly 10 comprises a quantum electric device 12, a normal-metal-insulator-superconductor (NIS) tunnel junction 13, and at least one superconductive lead 14 electrically connected to the at least one normal-metal-insulator-superconductor (NIS) tunnel junction for supplying a drive voltage $V_{QCR}$ for said NIS tunnel junction. The circuit assembly may be formed on a suitable substrate or wafer 11, such as a semiconductor substrate or any other suitable material. By a semiconductor substrate is meant herein a substrate having a surface, at least part of which is formed of a semiconductor material, e.g. silicon. Such semiconductor material may form a layer lying on a body or a support portion of the semiconductor substrate, such body or support portion being formed of some other material. Alternatively, the semiconductor material may cover the entire thickness of the semiconductor substrate.

The drive voltage $V_{QCR}$ used in this embodiment is around 2 mV and the capacitance $C_j$ of a NIS tunnel junction is about 0.01-100 fF per a NIS tunnel junction.

It is obvious for a skilled person that the circuit assembly further comprises the necessary circuitry that brings different components into a metallurgical (and thus into an electrical) contact with each other. The NIS tunnel junction 13 is electrically coupled in series between the at least one superconductive lead 14 for supplying a drive voltage $V_{QCR}$ and the quantum electric device 12.

Typically, the quantum electric device comprises at least one of the following: a quantum resonator, a qudit, a photodetector. Further, the quantum electric device may comprise at least one circuit comprising at least one quantum resonator, qudit or photodetector. More specifically, the quantum electric device may comprise at least one of the following: a one-quarter wavelength resonator, a superconducting coplanar waveguide (CPW) resonator, a quantum annealer.

Typically, the generated and supplied drive voltage $V_{QCR}$ is around 0.1 mV-0.3 mV, preferably around 0.2 mV, in case there is only one normal-metal-insulator-superconductor (NIS) tunnel junction 13 electrically coupled in series between the at least one superconductive lead for supplying a drive voltage $V_{QCR}$ and the quantum electric device. In case there are two normal-metal-insulator-superconductor tunnel junctions (SINIS or SIN-SIN), the drive voltage $V_{QCR}$ is around 0.4 mV. The person skilled in the art knows that the capacitance of the NIS tunnel junction, $C_j$, depends on the size and dimensions of the junctions and also on the thickness of the insulator layer in the NIS tunnel junction; typically, $C_j$ varies between 0.01 fF and 100 fF.

Figure 2:
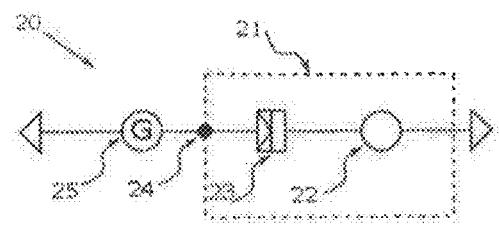
FIG. 2 illustrates the system for cooling a quantum electric device according to the present invention.

FIG. 2 shows an exemplifying structural view (not in scale) of another aspect of the present invention, the system for cooling a quantum electric device. The system 20 comprises a circuit assembly comprising a quantum electric device 22 to be cooled, a normal-metal-insulator-superconductor (NIS) tunnel junction 23 electrically connected to the quantum electric device 22, at least one superconductive lead 24 electrically connected to the normal-metal-insulator-superconductor (NIS) tunnel junction for supplying a drive voltage $V_{QCR}$ for said at least one normal-metal-insulator-superconductor (NIS) tunnel junction 23. In addition, the system 20 comprises means for generating a drive voltage $V_{QCR}$ 25. The circuit assembly may be formed on a suitable substrate or wafer 21, such as a semiconductor substrate or any other suitable material. It shall be noted that said means for generating a drive voltage $V_{QCR}$ may comprise a DC voltage generator (e.g. a DC power supply) or an AC voltage generator (e.g. an AC power supply), i.e. $V_{QCR}$ supplied to at least one NIS tunnel junction can be DC voltage or AC voltage.

It is obvious for a skilled person that the system further comprises the necessary circuitry that brings different components into a metallurgical (and thus into an electrical) contact with each other.

Figure 3:
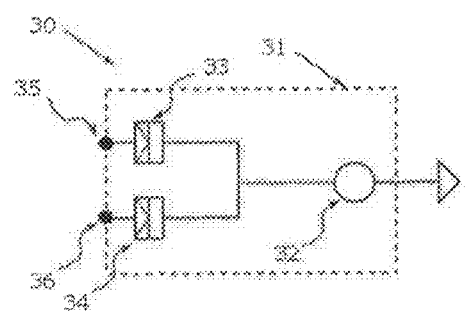
FIG. 3 illustrates the structure of a circuit assembly according to another embodiment of the present invention.

FIG. 3 shows an exemplifying structural view (not in scale) of another embodiment of the invention, a circuit assembly for cooling quantum electric devices. The circuit assembly 30 comprises a quantum electric device 32 to be cooled, two normal-metal-insulator-superconductor (NIS) tunnel junctions 33, 34 electrically coupled in series with one another, a first superconductive lead 35 and a second superconductive lead 36 for supplying a drive voltage $V_{QCR}$ for said NIS tunnel junctions. The two normal-metal-insulator-superconductor (NIS) tunnel junctions 33, 34 are electrically coupled in series (the quantum electric device to be cooled coupled in between) with respect to the means for generating the drive voltage $V_{QCR}$ (not shown) electrically connected to the superconductive leads, so the same electrical current passes through said tunnel junctions. The circuit assembly 30 may be formed on a suitable substrate or wafer 31, such as a semiconductor substrate or any other suitable material. The drive voltage $V_{QCR}$ used in this embodiment is around 0.4 mV and the capacitance $C_j$ is about 0.01-100 fF per one NIS tunnel junction.

Figure 4:
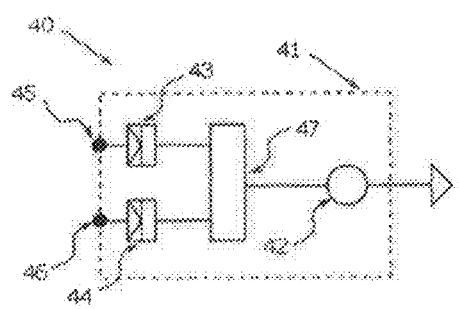
FIG. 4 illustrates the structure of a circuit assembly according to another embodiment of the present invention.

FIG. 4 shows an exemplifying structural view (not in scale) of another embodiment of the invention, a circuit assembly 40 for cooling quantum electric devices. The circuit assembly 40 comprises a quantum electric device 42 to be cooled, two normal-metal-insulator-superconductor (NIS) tunnel junctions 43, 44 electrically coupled in series with one another, a first superconductive lead 45 and a second superconductive lead 46 for supplying a drive voltage $V_{QCR}$ for said NIS tunnel junctions. Also in this embodiment the two normal-metal-insulator-superconductor (NIS) tunnel junctions 43, 44 are electrically coupled in series (the quantum electric device to be cooled 42 coupled in between) with respect to the means for generating the drive voltage $V_{QCR}$ (not shown) electrically connected to the superconductive leads, so the same electrical current passes through said tunnel junctions.

In addition, the circuit assembly 40 comprises a resistor 47 electrically coupled in series between the normal-metal-insulator-superconductor (NIS) tunnel junctions 43, 44 and the quantum electric device 42. The total resistance of the circuit assembly comprising a quantum electric device 42, two normal-metal-insulator-superconductor (NIS) tunnel junctions 43, 44 and a resistor 47 is typically between 0.01 Ω and 100Ω. The circuit assembly 40 may be formed on a suitable substrate or wafer 41, such as a semiconductor substrate or any other suitable material. It is clear for a skilled person that the lower the total resistance between the at least one NIS tunnel junction and the quantum device, the better.

Figure 5:
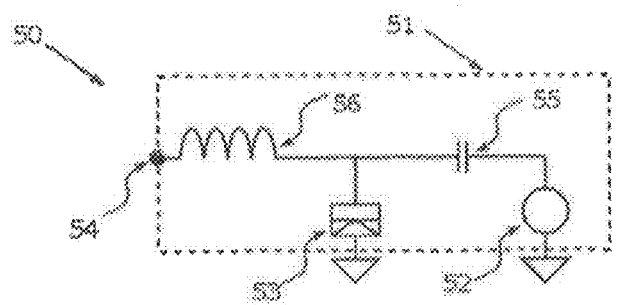
FIG. 5 illustrates the structure of a circuit assembly according to another embodiment of the present invention.

FIG. 5 shows an exemplifying structural view (not in scale) of another embodiment of the invention, a circuit assembly 50 for cooling quantum electric devices. The circuit assembly 50 comprises a quantum electric device 52, a normal-metal-insulator-superconductor (NIS) tunnel junction 53, a superconductive lead 54 electrically connected to the normal-metal-insulator-superconductor (NIS) tunnel junction 53 for supplying a drive voltage $V_{QCR}$ for said NIS tunnel junction, a capacitor 55 electrically coupled in series between the NIS tunnel junction 53 and the quantum electric device 52, and a coil 56 electrically coupled in series between the superconductive lead 54 and the NIS tunnel junction 53. The circuit assembly 50 may be formed on a suitable substrate or wafer 51, such as a semiconductor substrate or any other suitable material. In this embodiment, the purpose of the capacitor 55 is to block the DC voltage from the quantum device. The purpose of the coil 56 is to block the photons emitted by the quantum device from reaching the means for generating the drive voltage, i.e. a generator or a power supply.

In this embodiment, the quantum electric device 52 is capacitively coupled to the circuit assembly 50. The capacitance $C_{cap}$ of the capacitor 55 can vary and the exact value is not important. In the case $C_{cap} \gg C_j$, i.e. $C_{cap}$ being at least several times greater than $C_j$, $C_{cap}$ does not substantially affect ρ. However, if $C_{cap}$ is less than several times greater than $C_j$, it will decrease p and thus increase the effective capacitance of the quantum electric device.

Typically, the coil 56 comprises superconductive wires fabricated from a superconductive material such as NbN. In one embodiment, the cross-section of said superconductive wire is about 10 nm×20 nm. The skilled person is aware that there are also other possibilities of creating inductance in the circuit assembly, e.g. by means of Josephson junctions coupled in series or kinetic inductance.

Figure 6:
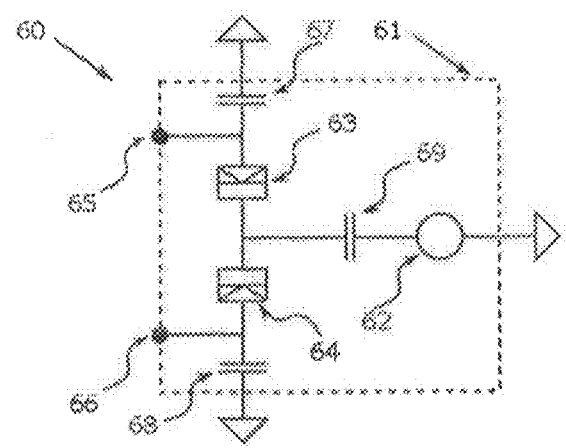
FIG. 6 illustrates the structure of a circuit assembly according to another embodiment of the present invention.

FIG. 6 shows an exemplifying structural view (not in scale) of another embodiment of the invention, a circuit assembly 60 for cooling quantum electric devices. The circuit assembly comprises a quantum electric device 62 to be cooled, two normal-metal-insulator-superconductor (NIS) tunnel junctions 63, 64 electrically coupled in series with one another, a first superconductive lead 65 electrically connected to the first tunnel junction 63 and a second superconductive lead 66 electrically connected to the second tunnel junction 64. Said superconductive leads are intended for supplying a drive voltage $V_{QCR}$ for said NIS tunnel junctions generated by suitable generating means (not shown), such as a DC or AC power supply that is electrically connected to the superconductive leads 65, 66. Thus, the two normal-metal-insulator-superconductor (NIS) tunnel junctions 63, 64 are electrically coupled in series with respect to the means for generating the drive voltage $V_{QCR}$. The circuit assembly further comprises a capacitor 69 electrically coupled in series between the NIS tunnel junctions 63, 64 and a quantum electric device 62. As shown in FIG. 6, the quantum electric device 62 is coupled in between the NIS tunnel junctions 63, 64.

The first NIS tunnel junction 63 and the second NIS tunnel junction 64 are coupled to a shared ground by at least one capacitor 67 and 68, respectively. The circuit assembly 60 may be formed on a suitable substrate or wafer 61, such as a semiconductor substrate or any other suitable material. Also in this embodiment, the quantum electric device 62 is capacitively coupled to the circuit assembly 60. Different coupling schemes such as inductive coupling can be used as well.

Next, a typical fabrication process of a sample comprising the circuit assembly according to the present invention is reviewed. The samples of the circuit assembly are fabricated on 4" prime-grade intrinsic silicon wafers; however also other suitable substrates or wafers may be used. The fabricated quantum electric device is a resonator which is defined with optical lithography and deposited using an electron beam evaporator, followed by a lift-off process.

The nanostructures of the NIS tunnel junctions are defined by electron beam lithography. A bilayer resist mask consisting of poly(methyl methacrylate) and poly[(methyl methacrylate)-co-(methacrylic acid)] is employed to enable three-angle shadow evaporation. The tri-layer nanostructures are deposited in an electron beam evaporator, with in-situ oxidation in between the first layer (Al) and the second layer (Cu) to form the NIS tunnel junctions. Aluminum oxide films formed may be etched away using argon plasma before depositions onto the aluminum. The third layer (Al) forms a clean contact with the second layer which functions as the normal-metal in our low-temperature experiments. A lift-off process is performed to remove excess metal. The parameters of the fabricated superconducting resonator and NIS tunnel junctions are indicated in Table 1.

Cryogenic electrical measurements were carried out in order to demonstrate the ability of the circuit assembly comprising a quantum electric device and at least one normal-metal-insulator-superconductor (NIS) tunnel junction to directly cool said quantum electric device. The fabricated and studied quantum electric device was a superconducting resonator.

The measurements took place in a cryogen-free dilution refrigerator with a base temperature of 10 mK. The silicon chip supporting the sample is attached with vacuum grease to the printed circuit board (PCB) in the sample holder and wedge bonded to the electrical leads of the PCB using an aluminum wire. For each dc line, an individual resistive Thermocoax cable was employed, which cable runs without interruption from the mixing chamber plate of the dilution refrigerator to room temperature. The coaxial cables used to connect the sample to the electronics were properly filtered and attenuated to suppress excess noise. Multiple radiation shields at millikelvin temperatures were utilized to suppress noise from the free-space radiation. Microwave sources were used to excite and probe the qubits.

Homodyne measurement using a microwave mixer at room temperature may be performed to reveal the phase shift of the probe signal due to dispersive interaction with the qubit, and hence the qubit state. For fabricating high-quality resonators, TiNi films on a 2-nm-thick SiNi layer on intrinsic silicon were employed. Optical lithography defined the resonators and most parts of the qubits. Two-angle shadow evaporation was employed only in the vicinity of the Josephson junctions.

Figure 7:
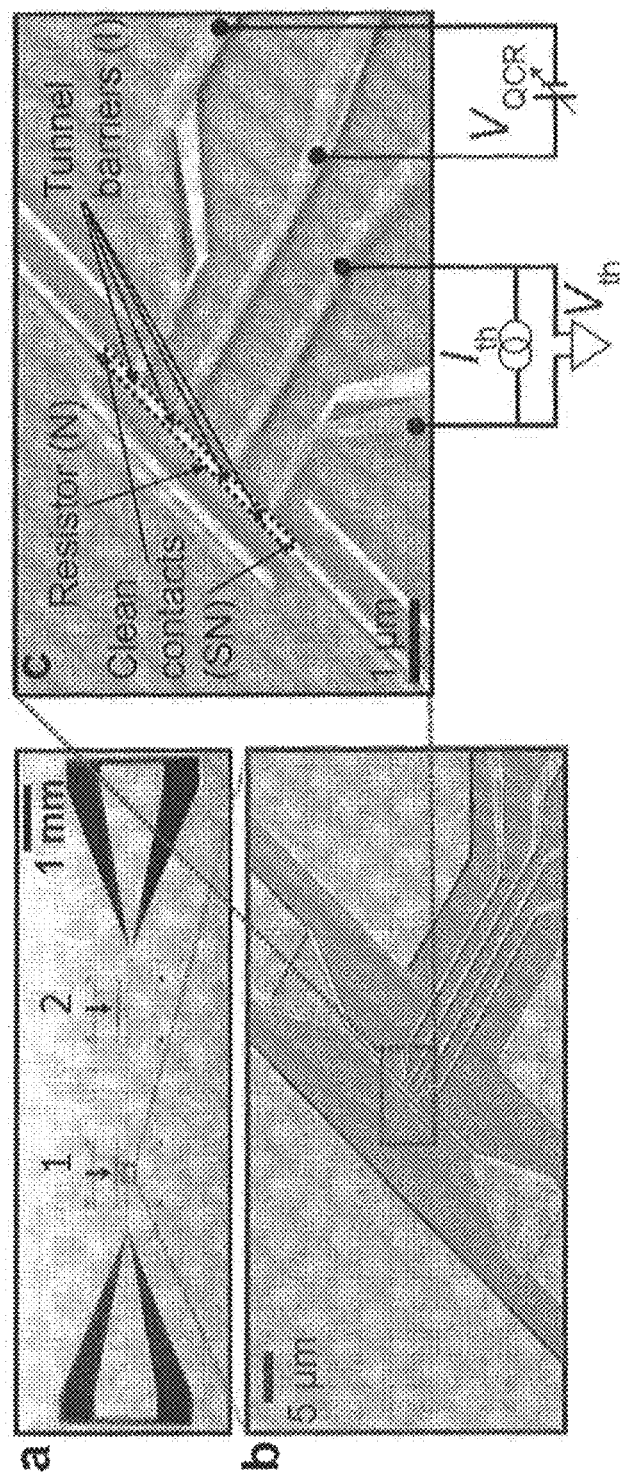
FIGS. 7a, 7b and 7c illustrate the structure of a circuit assembly and show a scanning electron microscope (SEM) image of NIS tunnel junctions of an embodiment of the present invention.

FIG. 7a shows the active sample of the circuit assembly according to the present invention. The circuit assembly 1 comprises a quantum electric device, a quantum resonator, NIS tunnel junctions and circuitry for their coupling to the desired electromagnetic excitations of the quantum electric device. In addition, FIG. 7a shows a probe resistor 2. The purpose of said probe resistor is to measure the temperature of the quantum resonator. A typical value of said probe resistor varies between 1-100Ω.

The NIS tunnel junctions, the circuitry for their coupling and the probe resistor 2 are embedded near the opposite ends of a 9.3 GHz superconducting coplanar-waveguide resonator. The parameters related to the resonator and the circuit assembly are indicated in Table 1.

In order to cool said superconducting resonator, a drive voltage $V_{QCR}$ is supplied to the two NIS junctions. The probe resistor and said two NIS junctions are both equipped with an additional pair of NIS junctions. Using calibration against the bath temperature, the observed voltage excursions across these thermometer junctions provide independent measures of the electron temperatures of the NIS tunnel junctions, $T_{QCR}$, and of the probe resistor, $T_{probe}$.

TABLE 1

The parameters of the fabricated superconducting resonator and NIS tunnel junctions that were studied.

| Parameter | Symbol | Value | Unit |
| --- | --- | --- | --- |
| Resonator length | L | 6.833 | mm |
| Inductance per unit length | $L_1$ | $4.7 \times 10^{-10}$ | H/m |
| Capacitance per unit length | $C_1$ | $1.3 \times 10^{-10}$ | F/m |
| Fundamental resonance frequency | $f_0$ | 9.32 | GHz |
| Distance of the resistors from resonator edge | x | 100 | μm |
| Dynes parameter | $\gamma_D$ | $1 \times 10^{-4}$ | |
| Normal state junction (tunneling) resistance | $R_T$ | 23.4 | kΩ |
| Resistance of the NIS tunnel junctions, circuitry and probe resistors | R | 46 | Ω |
| Superconductor energy gap | Δ | 214 | μeV |

FIG. 7b shows the enlarged part of FIG. 7a, a scanning electron microscope (SEM) image of four NIS tunnel junctions and both ends of their resistor being coupled to the central wire of the quantum resonator.

FIG. 7c shows the enlarged part of FIG. 7a and presents a SEM image of NIS tunnel junctions. There are four NIS tunnel junctions. The normal-metal layer (N), the insulating layers (I), acting as tunnel barriers for a tunneling electron, and superconductor (S) materials are indicated. For clarity, the normal-metal which acts as a resistor is marked with a dotted line. Contacts acting as tunnel barriers and clean contacts (i.e. galvanic contacts without an insulating layer between them) are indicated with arrows. The drive voltage $V_{QCR}$ is supplied to the circuit assembly, while the electron temperature of the normal-metal is obtained from the voltage $V_{th}$ across a pair of NIS junctions supplied with the current $I_{th}$ which may assume, for example, the value of 17 pA.

Figure 8:
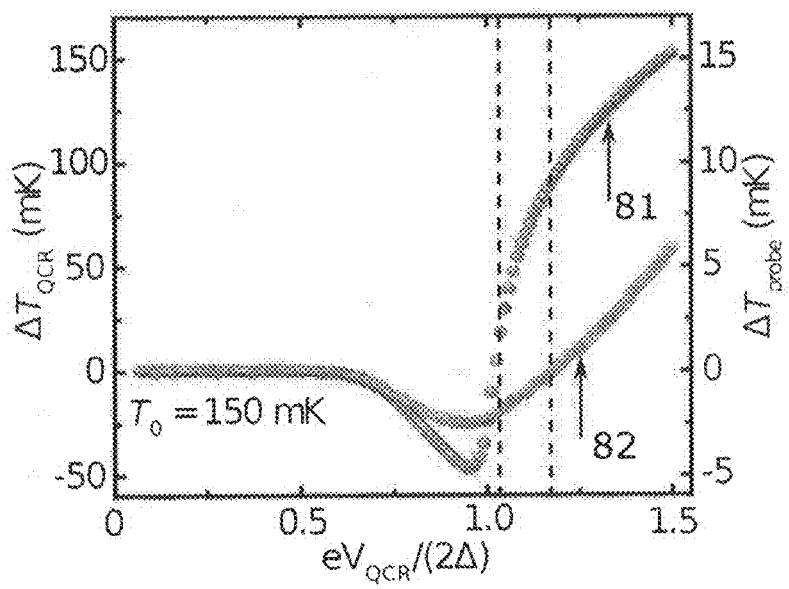
FIG. 8 shows changes in the electron temperatures of the circuit assembly according to the present invention, $\Delta T_{QCR}$, and a probe resistor, $\Delta T_{probe}$, as functions of the drive voltage $V_{QCR}$.

FIG. 8 shows the measurement results. It illustrates changes in the electron temperatures of the device according to the present invention, $\Delta T_{QCR}$, $\Delta T_{probe}$, as functions of the drive voltage $V_{QCR}$ of the device. The first curve 81 corresponds to a temperature change of the circuit assembly comprising a quantum electric device according to the present invention, $\Delta T_{QCR}$, and the second curve 82 to a temperature change of the probe resistor, $\Delta T_{probe}$. By measuring the temperature of the probe resistor it is possible to obtain the temperature change of the cooled quantum device.

It is clear for a skilled person that the probe resistor is not a necessary component for the functioning of the circuit assembly or a system for cooling a quantum electric device according to the present invention. Also, the performance of the quantum electric device does not depend on the probe resistor.

At the illustrated drive voltage $eV_{QCR}/(2\Delta)=1.05-1.20$ (in FIG. 8 this region is limited with two vertical dashed lines), so-called elastic tunneling dominates, and hence the chip comprising the NIS tunnel junctions and a quantum electric device is heated above the bath (ambience) temperature $T_0=150$ mK, although the temperature of the probe exhibits cooling in the region. Here, d is about 214 μeV. Since electrons cannot tunnel from the circuit assembly into the superconductor unless they overcome the energy gap $2\Delta \approx 430$ μeV in the superconductor density of states, the electron temperatures stay essentially unchanged for drive voltages well below $2\Delta/e$, where e is the elementary charge.

In FIG. 8 in the region limited with two vertical dashed lines the temperature of the circuit assembly comprising a quantum electric device (according to curve 81) is higher than that for $eV_{QCR}/(2\Delta)=0$, but the temperature of the probe resistor (according to curve 82) is lower than that for $eV_{QCR}/(2\Delta)=0$. The temperature drop of the probe is caused by the photon-assisted tunneling, which cools the quantum electric device in between.

Note that the above voltage region is only important for the observation of the refrigeration effect in this device, thanks to the high cooling power at voltages above the superconductor gap. However, lower drive voltages should be used in general to achieve lower final temperatures of high-quality electric quantum devices.

Slightly below the gap voltage $2\Delta/e$ however, both electron temperatures are significantly decreased. Here, the high-energy electrons at the normal-metal-insulator-superconductor (NIS) tunnel junctions overcome the superconductor energy gap and tunnel out of the normal-metal, thus evaporatively cooling it. Typically, the observed temperature drop at the probe resistor would be simply explained by conduction of heat from it to the colder normal-metal-insulator-superconductor (NIS) tunnel junctions. However, this explanation is excluded by the inventor's observation that at drive voltages slightly above the gap voltage, the electron temperature in the normal-metal-insulator-superconductor (NIS) tunnel junctions is well elevated but the probe resistor remains cooled.

Figure 9:
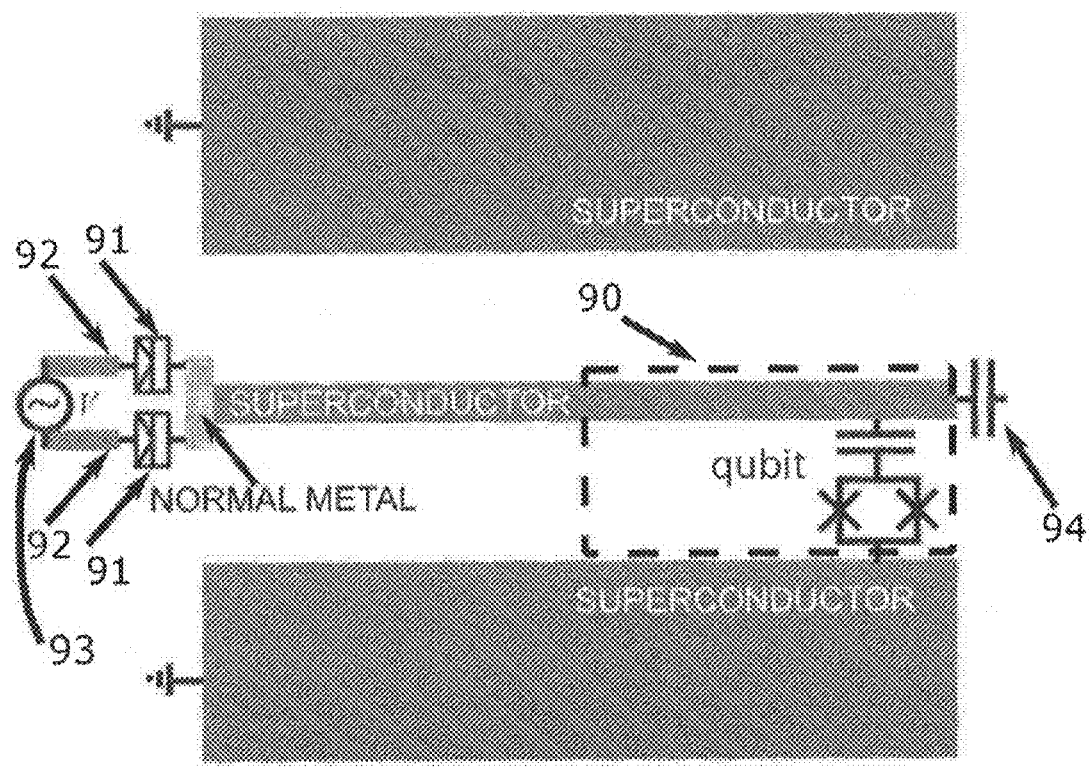
FIG. 9 shows the system for cooling a quantum electric device according to one embodiment of the present invention.

FIG. 9 shows the system for cooling a quantum electric device according to one embodiment of the present invention. The system comprises
- a quantum electric device 90 to be cooled, said quantum electric device comprising a qubit,
- two normal-metal-insulator-superconductor tunnel (SIN) junctions 91,
- two superconductive leads 92 electrically connected to the two SIN junctions for supplying a drive voltage $V_{QCR}$ for said two normal-metal-insulator-superconductor tunnel junctions,
- means 93 for generating the drive voltage $V_{QCR}$.

The quantum electric device 90 to be cooled is electrically coupled in between said two normal-metal-insulator-superconductor (NIS) tunnel junctions. The two normal-metal-insulator-superconductor tunnel junctions are electrically coupled in series with respect to one another (the quantum electric device being in between) and to the superconductive leads (i.e. in series related to the means for generating the drive voltage), so that the same electrical current passes through said junctions when the means for generating the drive voltage are switched on. The superconductive leads are electrically connected to the means for generating the drive voltage via bondwires (not shown). The quantum electric device is additionally coupled 94 to a probe circuitry (not shown). However, it shall be noted that in certain cases, it is also possible to generate the drive voltage by means of a voltage generator situated on the same chip comprising the NIS tunnel junctions and a quantum electric device.

The bondwires may comprise at least one of the following metals: aluminum, copper, silver, gold. Making interconnections by means of wire bonding is a practice well known for those skilled in the art, and no detailed explanation is required. In this embodiment, the means for generating a drive voltage $V_{QCR}$ comprise an AC voltage generator (i.e. an AC power supply). Thus, $V_{QCR}$ supplied to the NIS tunnel junction is AC voltage. However, it shall be noted that the means for generating a drive voltage $V_{QCR}$ may also comprise a DC voltage generator (i.e. a DC power supply).

Figure 10:
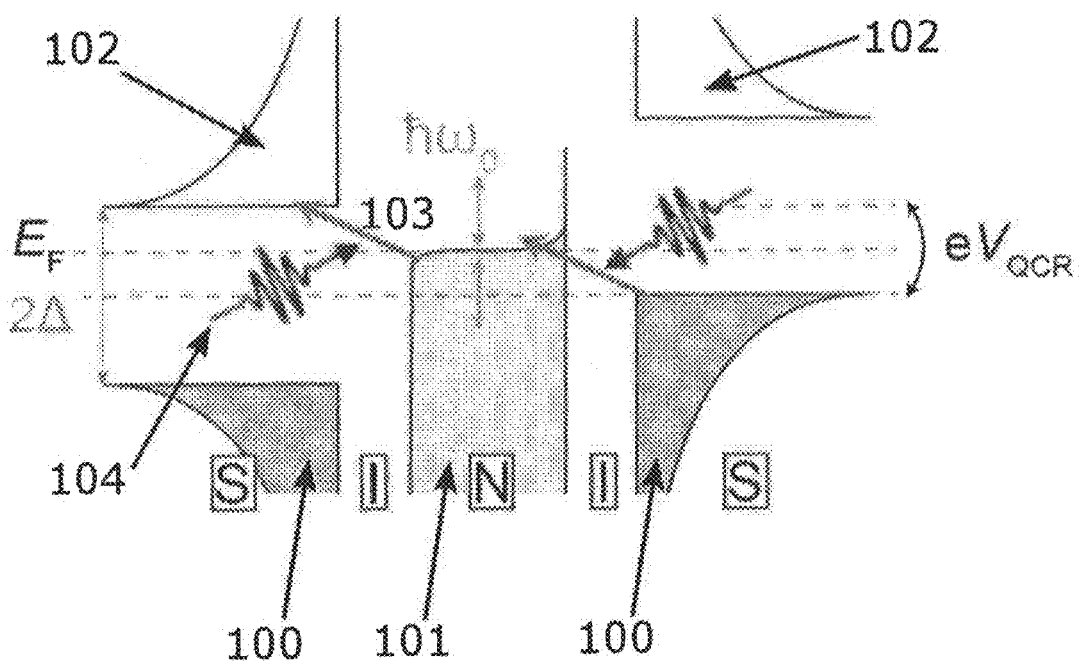
FIG. 10 illustrates a schematic diagram of photo-assisted single-electron tunneling events in the circuit assembly according to one embodiment of the present invention.

FIG. 10 illustrates a schematic diagram of photo-assisted single-electron tunneling events in the circuit assembly according to one embodiment of the present invention. Sections 100 are the energy states occupied by electrons in a superconductor S. Section 101 displays the energy states occupied by electrons in a normal-metal N. Sections 102 display empty (not occupied) energy states. It is obvious for a skilled person that an electron can tunnel from only an occupied state to only an empty state.

The symbol $E_F$ in FIG. 10 is the Fermi level, i.e. the electrochemical potential of the normal-metal, which lies between the Fermi-levels of superconductors. The quantum electric device is affected by photon-assisted tunneling, being cooled when promoting a low-energy electron 103 from the normal-metal to the superconductor. The quantum electric device heats up when receiving a photon during tunneling of a high-energy electron from the normal-metal to the superconductor. However, this tunneling rate is exponentially suppressed due to the low thermal occupation of high-energy electrons. Therefore, the quantum electric device cools down, resulting in the experimental observations shown in FIG. 8.

It is shown in FIG. 10 that a superconductor does not have any empty states at the energy gap $2\Delta$. In order for an electron 103 to have enough energy to tunnel from a normal-metal to an empty energy level in a superconductor, it has to absorb a photon 104. The energy of a photon shown in FIG. 10 is high, $E=\Delta/2$. During the photon-assisted electron tunneling from a normal-metal to a superconductor, the electron receives energy $\Delta/2$ from the means for generating the drive voltage (e.g. a voltage generator) and the necessary additional energy $E=\Delta/2$ from the photon.

The following items shall be considered when choosing an optimal drive voltage $V_{QCR}$:

it is desirable to reduce the number of those processes where thermal electrons emit a photon to the quantum electric device, i.e.

$\Delta - eV_{QCR}/N + \hbar\omega_0 >> k_B T$, where $T$ is electron temperature in a normal-metal;

it is desirable to keep the number of elastic tunneling events low in order not to create quasiparticles in the system, i.e.

$\Delta - eV_{QCR}/N >> k_B T$, where $T$ is electron temperature in a normal-metal;

it is obviously desirable that electrons are able to absorb a photon and tunnel in a superconductor, i.e.

$\Delta - eV_{QCR}/N - \hbar\omega_0 < k_B T$, where it is meant that the left side of the inequality cannot be (much) larger than $k_B T$.

The conditions explained above are fulfilled in the photo-assisted single-electron tunneling event shown in FIG. 10.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A circuit assembly for cooling a quantum electric device through photon-assisted single-electron tunneling from a normal-metal to a superconductor, the circuit assembly comprising a quantum electric device to be cooled, wherein the circuit assembly further comprises:

at least one normal-metal-insulator-superconductor (NIS) tunnel junction electrically connected to the quantum electric device, at least one superconductive lead electrically connected to the at least one normal-metal-insulator-superconductor (NIS) tunnel junction for supplying a drive voltage $V_{QCR}$ for said at least one normal-metal-insulator-superconductor (NIS) tunnel junction, wherein the energy difference $\hbar\omega_0/(2\pi)$ between two energy states of the quantum electric device is in the range of h(0.3-300 GHz), where h is the Planck constant; and wherein the effective capacitance C of the quantum electric device is given by $C=\pi/(\rho R_K \omega_0)$, wherein $R_K$ is the von Klitzing constant, and p is the zero-temperature probability of a photon capture event in the course of a single-electron tunneling event which lies in the range of 0.00001-0.1.

2. The circuit assembly according to claim 1, wherein the tunneling resistance $R_T$ of the at least one NIS tunnel junction is substantially in the range of 10 kΩ-100 MΩ.

3. The circuit assembly according to claim 1, wherein the circuit assembly comprises two normal-metal-insulator-superconductor (NIS) tunnel junctions electrically coupled in series with respect to one another and to at least one superconductive lead, and the quantum electric device electrically coupled in between said two normal-metal-insulator-superconductor (NIS) tunnel junctions.

4. The circuit assembly according to claim 1, wherein the circuit assembly comprises two normal-metal-insulator-superconductor (NIS) tunnel junctions electrically coupled in parallel with respect to one another between the quantum electric device and at least one superconductive lead.

5. The circuit assembly according to claim 1, wherein the circuit assembly further comprises at least one lithographically manufactured interdigitated capacitor electrically coupled in series between the at least one normal-metal-insulator-superconductor (NIS) tunnel junction and the quantum electric device.

6. The circuit assembly according to claim 1, wherein the circuit assembly further comprises at least one lithographically manufactured thin-film parallel plate capacitor comprising at least one layer comprising two superconductive films separated by a dielectric layer, said thin-film parallel plate capacitor electrically coupled in series between the at least one normal-metal-insulator-superconductor (NIS) tunnel junction and the quantum electric device.

7. The circuit assembly according to claim 1, wherein the circuit assembly further comprises at least one lithographically manufactured interdigitated capacitor electrically coupled in series between the at least one normal-metal-insulator-superconductor (NIS) tunnel junction and a ground.

8. The circuit assembly according to claim 1, wherein the circuit assembly further comprises at least one lithographically manufactured thin-film parallel plate capacitor comprising at least one layer, said layer comprising two superconductive films separated by a dielectric layer, said thin-film parallel plate capacitor being electrically coupled in series between the at least one normal-metal-insulator-superconductor (NIS) tunnel junction and a ground.

9. The circuit assembly according to claim 1, wherein the circuit assembly further comprises at least one lithographically manufactured resistor electrically coupled in series between the at least one normal-metal-insulator-superconductor (NIS) tunnel junction and the quantum electric device.

10. The circuit assembly according to claim 1, wherein the circuit assembly further comprises at least one coil comprising superconductive wires and electrically coupled in series between the at least one superconductive lead for supplying a drive voltage $V_{QCR}$ and the at least one normal-metal-insulator-superconductor (NIS) tunnel junction.

11. The circuit assembly according to claim 1, wherein the drive voltage $V_{QCR}$ is AC voltage.

12. The circuit assembly according to claim 1, wherein the quantum electric device is a quantum annealer.

* * * * *